(12) United States Patent
Lee et al.

(10) Patent No.: US 8,013,354 B2
(45) Date of Patent: Sep. 6, 2011

(54) LIGHT EMITTING DEVICE HAVING MULTI-PATTERN STRUCTURE AND METHOD OF MANUFACTURING SAME

(75) Inventors: Jeong-wook Lee, Yongin-si (KR); Jin-seo Im, Yongin-si (KR); Bok-ki Min, Yongin-si (KR); Kwang-hyeon Baik, Yongin-si (KR); Heon-su Jeon, Yongin-si (KR)

(73) Assignees: Samsung LED Co., Ltd. (KR); Seoul National University Industry Foundation (KR)

( * ) Notice: Subject to any disclaimer, the term of this patent is extended or adjusted under 35 U.S.C. 154(b) by 908 days.

(21) Appl. No.: 11/737,479

(22) Filed: Apr. 19, 2007

(65) Prior Publication Data

US 2007/0262330 A1    Nov. 15, 2007

(30) Foreign Application Priority Data

May 15, 2006   (KR) .................. 10-2006-0043477

(51) Int. Cl.
*H01L 29/22* (2006.01)
(52) U.S. Cl. .............. 257/99; 257/E33.067; 438/29
(58) Field of Classification Search ............ 257/98–100, 257/79, E33.067–E33.069; 438/481; 372/50.1, 372/102–103, 105
See application file for complete search history.

(56) References Cited

U.S. PATENT DOCUMENTS

| | | | | |
|---|---|---|---|---|
| 6,787,692 B2* | 9/2004 | Wada et al. | ........... | 136/256 |
| 2004/0113166 A1* | 6/2004 | Tadatomo et al. | ........... | 257/98 |
| 2005/0082546 A1 | 4/2005 | Lee et al. | | |
| 2005/0112886 A1 | 5/2005 | Asakawa et al. | | |
| 2005/0221521 A1 | 10/2005 | Lee et al. | | |
| 2005/0285128 A1* | 12/2005 | Scherer et al. | ........... | 257/98 |
| 2006/0054898 A1 | 3/2006 | Lai et al. | | |
| 2006/0157719 A1* | 7/2006 | Kwak et al. | ........... | 257/95 |
| 2006/0204865 A1* | 9/2006 | Erchak et al. | ........... | 430/7 |
| 2006/0273333 A1* | 12/2006 | Wu et al. | ........... | 257/94 |

FOREIGN PATENT DOCUMENTS

| | | |
|---|---|---|
| EP | 1180725 | 2/2002 |
| EP | 1677365 | 7/2006 |
| KR | 1020050038207 | 4/2005 |
| KR | 1020060000464 | 1/2006 |
| TW | 253771 | 4/2006 |
| WO | 0141225 | 6/2001 |

OTHER PUBLICATIONS

Korean Office Action for Application No. 10-2006-0043477 dated May 30, 2007 with English Translation.
European Search Report for application No. 07100133.3-2222 dated Aug. 5, 2009.

* cited by examiner

*Primary Examiner* — Matthew W Such
*Assistant Examiner* — Ali Naraghi
(74) *Attorney, Agent, or Firm* — Cantor Colburn LLP

(57) ABSTRACT

A semiconductor light emitting device having a multiple pattern structure greatly increases light extraction efficiency. The semiconductor light emitting device includes a substrate and a semiconductor layer, an active layer, and an electrode layer formed on the substrate, a first pattern defining a first corrugated structure between the substrate and the semiconductor layer, and a second pattern defining a second corrugated structure on the first corrugated structure of the first pattern.

20 Claims, 7 Drawing Sheets

LIGHT EMITTING DEVICE HAVING MULTI-PATTERN STRUCTURE AND METHOD OF MANUFACTURING SAME

This application claims priority to Korean Patent Application No. 10-2006-0043477, filed on May 15, 2006, and all the benefits accruing therefrom under 35 U.S.C.§119, the contents of which in its entirety are herein incorporated by reference.

BACKGROUND OF THE INVENTION

1. Field of the Invention

The present invention relates to a light emitting device having a pattern structure, and more particularly, to a light emitting device having a multiple pattern structure which can easily control defect density and stress distribution of the light emitting device and can increase light extraction efficiency by forming a multiple corrugated pattern on a surface of a substrate used in the light emitting device.

2. Description of the Related Art

Conventional semiconductor light emitting devices can be classified into laser diodes ("LDs") and light emitting diodes ("LEDs"). LEDs use characteristics of compound semiconductors which convert electrical energy into infrared rays, visible light or signals in the formed of light.

Group III nitride group compound semiconductors are direct transition type semiconductors, and are widely used in light emitting devices such as LEDs or LDs, since stable operation thereof can be obtained at a higher temperature compared to devices that use other semiconductors. Group III nitride group compound semiconductors are usually formed on substrates formed of sapphire $Al_2O_3$.

Figure 1:
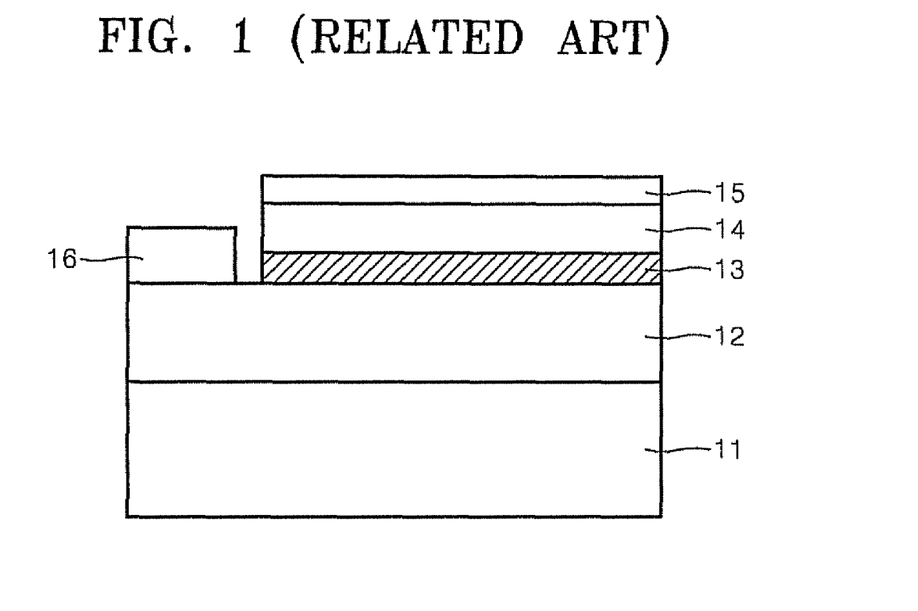
FIG. 1 is a cross-sectional view illustrating a conventional structure of a general Group III nitride group compound semiconductor having a flat structure.

FIG. 1 is a cross-sectional view illustrating a conventional structure of a Group III nitride group compound semiconductor light emitting device. Referring to FIG. 1, an n-GaN layer 12 is formed on a sapphire substrate 11, and an active layer 13, a p-GaN layer 14 and a p-type electrode 15 are sequentially formed on a portion of the n-GaN layer 12. An n-type electrode layer 16 is formed on the portion of the n-GaN layer 12 on which the active layer 13 is not formed.

In a conventional light emitting device as illustrated in FIG. 1, efficiency of light extraction from an inner side of the active layer 13, e.g., a lower side of the active layer 13 facing and in contact with the n-GaN layer 12, to the outside is an important issue. In order to efficiently extract light generated in a longitudinal direction of the sapphire substrate 11 and the active layer 13, efforts to form a transparent electrode or a reflection electrode have been made. However, a large portion of light generated in the active layer 13 proceeds in a horizontal direction (e.g., substantially perpendicular to the longitudinal direction). To extract light in the longitudinal direction, efforts have been made, for example, to form a reflection surface on a sidewall of a stacking structure of a semiconductor device after the sidewall having a predetermined angle is formed. However, this process is difficult and costly. Also, in order to increase optical output of the Group III nitride group compound semiconductor light emitting device which uses the sapphire substrate 11, a flip chip type device structure is employed. However, the light extraction efficiency remains approximately at 40% due to a refractive index difference between GaN and the sapphire substrate 11.

Figure 2A:
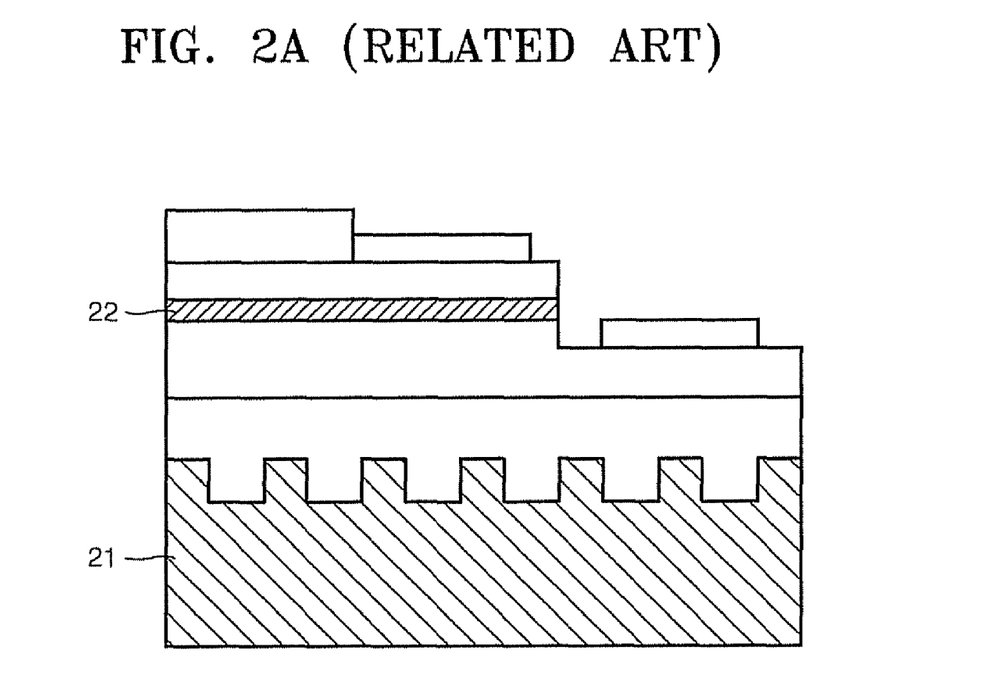
FIG. 2A is a cross-sectional view illustrating a conventional structure of a Group III nitride group compound semiconductor having a corrugated structure.

To supplement the light extraction efficiency, an LED structure as depicted in FIG. 2A has been introduced, that is, after a corrugated structure is formed on a surface of a sapphire substrate 21, semiconductor crystal layers including an active layer 22 are formed on the sapphire substrate 21. In the LED structure in FIG. 2A, a corrugated refractive interface is formed on a lower side of the active layer 22 to be able to extract a portion of light in the horizontal direction which normally disappears in the light emitting device.

Also, when a Group III nitride group compound semiconductor is formed on the sapphire substrate 21, a potential is generated due to mismatched lattice constants between the sapphire substrate 21 and the Group III nitride group compound semiconductor. FIGS. 2B (a) through 2B (d) are cross-sectional views illustrating a conventional process of forming a light emitting device on a substrate having a corrugated structure. To prevent mismatched lattice constants from occurring (e.g., a lattice constant miss fit), referring to FIG. 2B-d, the corrugated structure is formed on the sapphire substrate 21, and a GaN layer 23 is formed on the sapphire substrate 21. A process of forming an LED on the sapphire substrate 21 having the corrugated structure will now be described.

To form the GaN layer 23 on the sapphire substrate 21 having a corrugated structure as depicted in FIG. 2B (a), GaN facets 24 are grown on the upper part of patterns of the corrugated structure and sidewalls of each pattern of the corrugated structure, as illustrated in FIG. 2B (b). Afterward, as depicted in FIG. 2B (c), a planarized GaN layer 23 can be obtained. An active layer 22, a GaN layer 25 and a first electrode layer 26 are formed on a first region of the planarized GaN layer 23, and a second electrode layer 27 is formed on a second region of the planarized GaN layer 23. The completed LED is illustrated in FIG. 2B (d).

In the case of a semiconductor light emitting device having a simple corrugated structure, optical extraction efficiency is increased compared to a semiconductor light emitting device which uses a conventional flat substrate. However, there is a need to develop a semiconductor light emitting device which can further increase the optical extraction efficiency.

BRIEF SUMMARY OF THE INVENTION

The present invention provides a semiconductor light emitting device having a multi-pattern structure which can increase extraction efficiency of light generated from a light emitting layer by improving the substrate structure of a conventional light emitting device having a conventional flat substrate and a single corrugated pattern.

According to an aspect of the present invention, there is provided a semiconductor light emitting device having a multiple pattern structure, the semiconductor light emitting device including a substrate and a semiconductor layer, an active layer, and an electrode layer formed on the substrate, the multiple pattern structure comprising: a first pattern defining a first corrugated structure between the substrate and the semiconductor layer; and a second pattern defining a second corrugated structure on the first corrugated structure of the first pattern.

The second corrugated structure of the second pattern may be formed on at least one of protrusions and grooves defining of the first corrugated structure of the first pattern.

The first corrugated structure may comprise at least one of a rectilinear corrugated structure and a curved type corrugated structure.

The substrate may be formed of a material comprising sapphire or silicon (Si).

The second pattern may be may include nano dots formed of an optical transmitting material on at least one of protrusions and grooves defining the first corrugated structure of the first pattern.

The optical transmitting material may be silicon ("$SiO_2$") or silicon nitride ("$SiN_x$").

The semiconductor light emitting device may further comprise a first semiconductor layer formed on the substrate; an active layer, a second semiconductor layer and a first electrode layer sequentially formed on a first region of the first semiconductor layer; and a second electrode layer formed on a second region of the first semiconductor layer.

The protrusions may be curved type protrusions.

According to another aspect of the present invention, there is provided a method of forming a semiconductor light emitting device having a multiple pattern structure. The method includes: forming a first pattern defining a first corrugated structure between a substrate and a semiconductor layer; and forming a second pattern defining a second corrugated structure on the first corrugated structure of the first pattern.

BRIEF DESCRIPTION OF THE DRAWINGS

The above and other aspects, features and advantages of the present invention will become more apparent by describing in more detail exemplary embodiments thereof with reference to the attached drawings, in which:

FIGS. 2B (a) through 2B (d) are cross-sectional views illustrating a conventional process of forming a light emitting device on a substrate having a corrugated structure;

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings. According to an embodiment of the present invention, light extraction efficiency of a semiconductor light emitting device can be increased by forming a multiple pattern structure on a substrate thereof.

Figure 3:
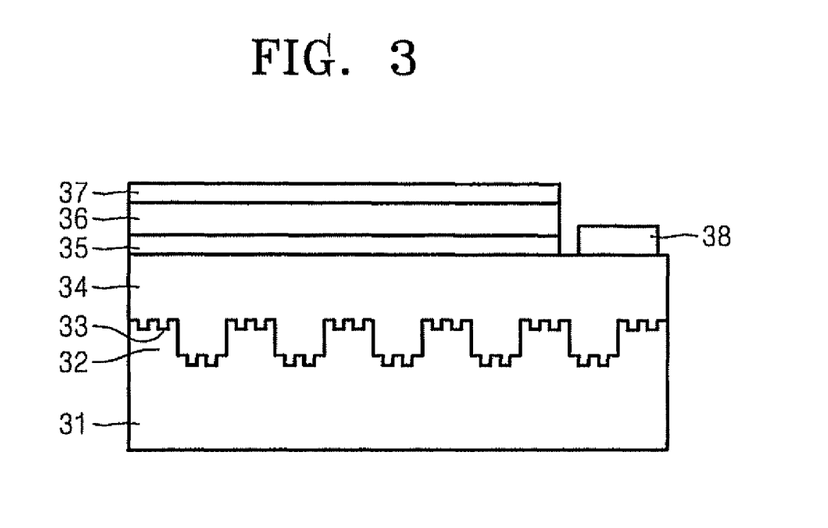
FIG. 3 is a cross-sectional view illustrating an exemplary embodiment of a semiconductor light emitting device having a multiple pattern structure according to the present invention.

FIG. 3 is cross-sectional view illustrating an exemplary embodiment of a semiconductor light emitting device having a multiple pattern structure according to the present invention.

Referring to FIG. 3, a first semiconductor layer 34 is formed on a substrate 31. An active layer 35, a second semiconductor layer 36 and a first electrode layer 37 are sequentially formed on a first region of the first semiconductor layer 34. A second electrode layer 38 is formed on a second region of the first semiconductor layer 34. The substrate 31 is a sapphire substrate which is used in typical semiconductor light emitting devices, however, the present invention is not limited thereto. For example, a substrate which can grow a Group III nitride group compound semiconductor such as silicon (Si) or silicon carbide ("SiC") can be used as the substrate 31.

The first semiconductor layer 34 can be formed of n-GaN, and the second semiconductor layer 36 can be formed of a material which includes p-GaN. The material for forming the first semiconductor layer 34 and the second semiconductor layer 36 is not limited to GaN, but may include a binary, tertiary or quaternary material, such as AlN or InN, for example.

According to an exemplary embodiment of the present invention, a multiple pattern structure is formed on a surface of the substrate 31. More specifically, a first pattern 32 is formed on the surface of the substrate 31, and a second pattern 33 is formed on a surface of the first pattern 32. There are no specific limitations to the shapes of the first and second patterns 32 and 33.

Figure 4A:
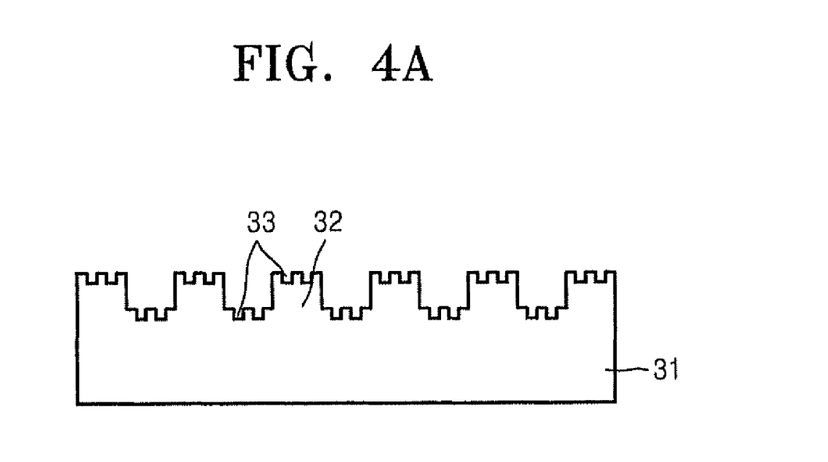
FIGS. 4A and 4B are cross-sectional views illustrating exemplary embodiments of substrates used in a light emitting device having a multiple pattern structure according to the present invention.
Figure 4B:
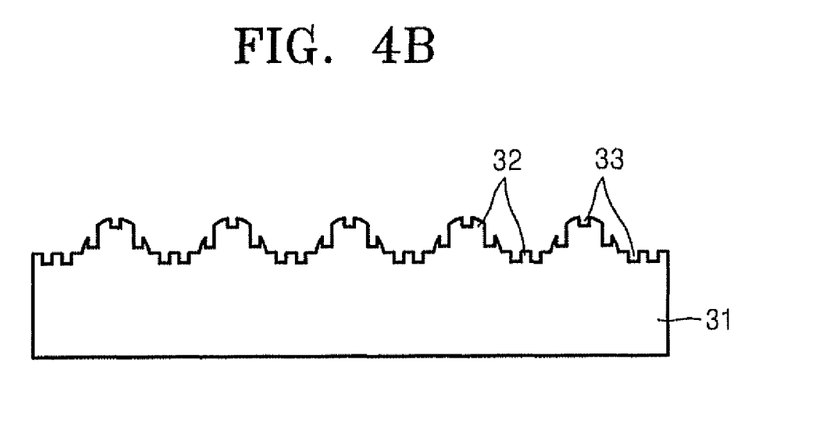

FIGS. 4A and 4B are cross-sectional views illustrating exemplary embodiments of substrates 31 used in a light emitting device having a multiple pattern structure according to the present invention.

Referring to FIG. 4A, the substrate 31 is a sapphire substrate or a Si substrate used in conventional semiconductor light emitting devices. A first pattern 32 having a step type, that is, a rectilinear corrugated shape is formed on a surface of the substrate 31. A second pattern 33 having a corrugated shape is formed on protrusions and grooves defining the first pattern 32. That is, the light emitting device according to the exemplary embodiment of the present invention illustrated in FIG. 4A includes the first pattern 32 and the second pattern 33 formed on the first pattern 32, and thus eventually has a multiple pattern structure. Also, in an alternative exemplary embodiment, another pattern structure (not shown) can be selectively formed on the second pattern 33.

In FIG. 4B, a first pattern 32 having a curved type corrugated pattern according to another exemplary embodiment of the present invention, unlike the step type corrugated pattern of FIG. 4A, is illustrated. Referring to FIG. 4B, the first pattern 32 having a curved type is formed on a surface of the substrate 31. A second pattern 33 having a corrugated shape is formed between the curved type protrusions of the first pattern 32. Also, in an alternative exemplary embodiment, another pattern structure or a third pattern (not shown) can be selectively formed on the second pattern 33. As a result, the light emitting device according to the exemplary embodiment of the present invention illustrated in FIG. 4B includes a substrate 31 having a multiple pattern structure. Here, the curved type protrusion structure can be a hemisphere or a stripe shape.

Figure 5A:
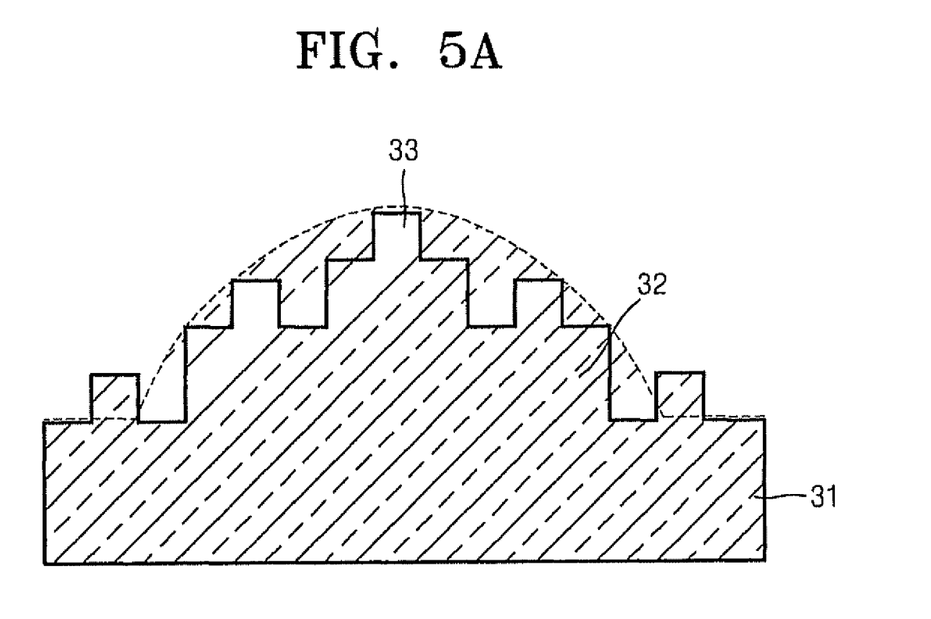
FIGS. 5A through 5C are cross-sectional views illustrating the formation of optical transmitting nano dots on an exemplary embodiment of a substrate of a light emitting device having a multiple pattern structure according to the present invention.
Figure 5B:
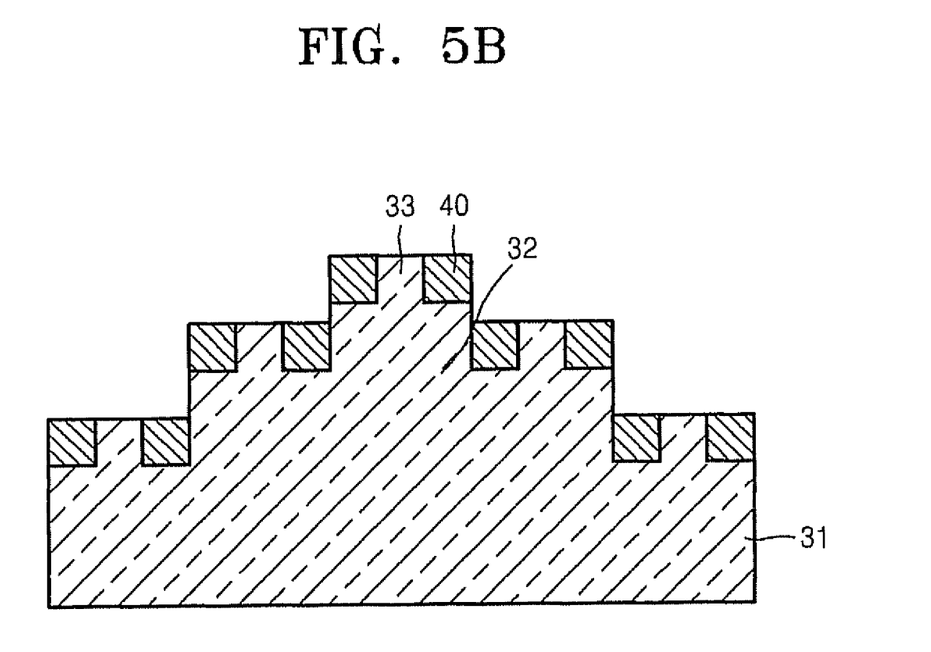
Figure 5C:
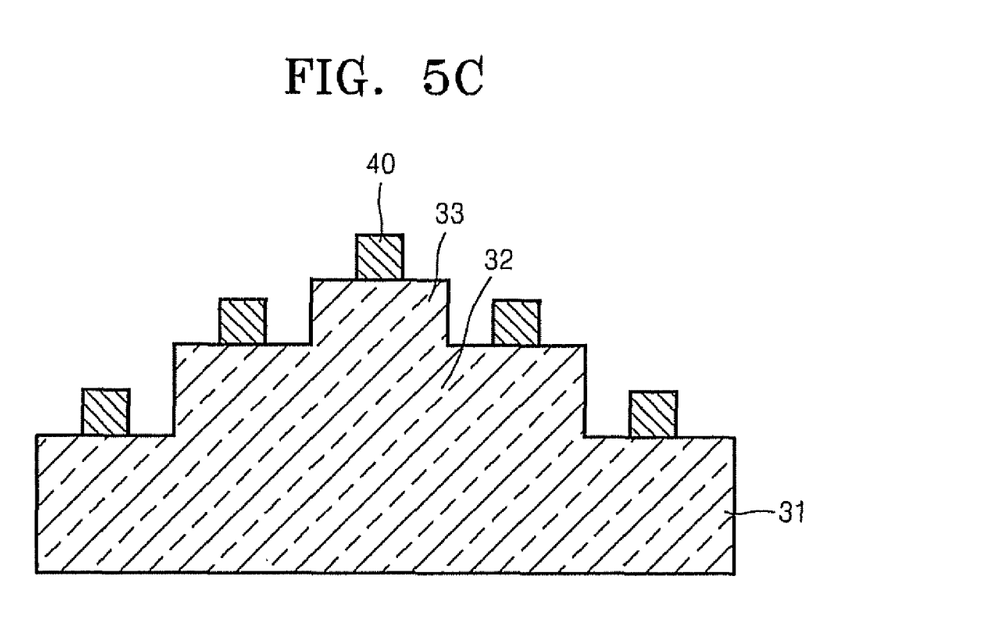

FIGS. 5A through 5C are enlarged cross-sectional views illustrating a portion of another exemplary embodiment of a substrate 31 of a light emitting device having a multiple pattern structure according to the present invention. Referring to FIG. 5A, a first pattern 32 is formed on the substrate 31, for example, a sapphire substrate, and a second pattern 33 is formed on a region of the first pattern 32. It can be seen that the first and second patterns 32 and 33 are each corrugated structures, respectively.

In order to maximize the light path changing effect using the refractive index difference at an interface between the substrate 31 and a semiconductor layer on the substrate 31, FIGS. 5B and 5C show structures in which an optical transmitting material, such as silicon oxide ("$SiO_2$") or silicon nitride ("$SiN_x$"), which has a refractive index different from the substrate 31, is formed in nano dots 40 on a pattern and between patterns. That is, in this way, the optical transmitting material can be formed in nano dots 40 on a surface of the first pattern 32 of the substrate 31 so that the optical transmitting material can perform the same function as the second pattern 33.

Accordingly, in the light emitting device having a multiple pattern structure according to the current exemplary embodiments of the present invention, the surface of the substrate 31 can be formed into a multiple pattern structure, an optical transmitting material formed in a pattern structure can be formed on the substrate 31, or a structure in which the multiple pattern structure and the optical transmitting material formed in a pattern can be used.

Hereinafter, an exemplary embodiment of a method of manufacturing a light emitting device having a multiple pattern structure according to the present invention will be described. In the present exemplary embodiment, to form the multiple pattern structure on a surface of a substrate, at least two dry etching processes are performed.

First, a flat substrate, for example, a sapphire substrate is provided. A patterned photoresist is located on the substrate, and a first pattern is formed using a photolithography process, for example, a reactive ion etching ("RIE") process.

An etching gas may be selected from a Cl group gas such as $Cl_2$, $BCl_3$, $HCl$, $CCl_4$, and $SiCl_4$, for example. Gas pressure may be controlled between a few mTorr to a few tens of mTorr according to the etching gas or situation. In order to form nano dots of optical transmitting material, such as $SiO_2$ or silicon nitride, after a thin film of the optical transmitting material such as $SiO_2$ or silicon nitride is coated on a surface of the substrate, a mask having predetermined regions which are open, is disposed on the thin film. Afterwards, the open regions are etched.

After a multiple pattern structure is formed on a surface of the substrate, an n-GaN layer, an active layer, a p-GaN layer and a P-type electrode layer which are required to form a light emitting device are sequentially formed on the substrate, respectively. The compound semiconductor layers in the light emitting device having a multiple pattern structure according to an exemplary embodiment of the present invention have shapes not very different from conventional shapes, and can be readily formed using well known processes known in the art.

Figure 2B:
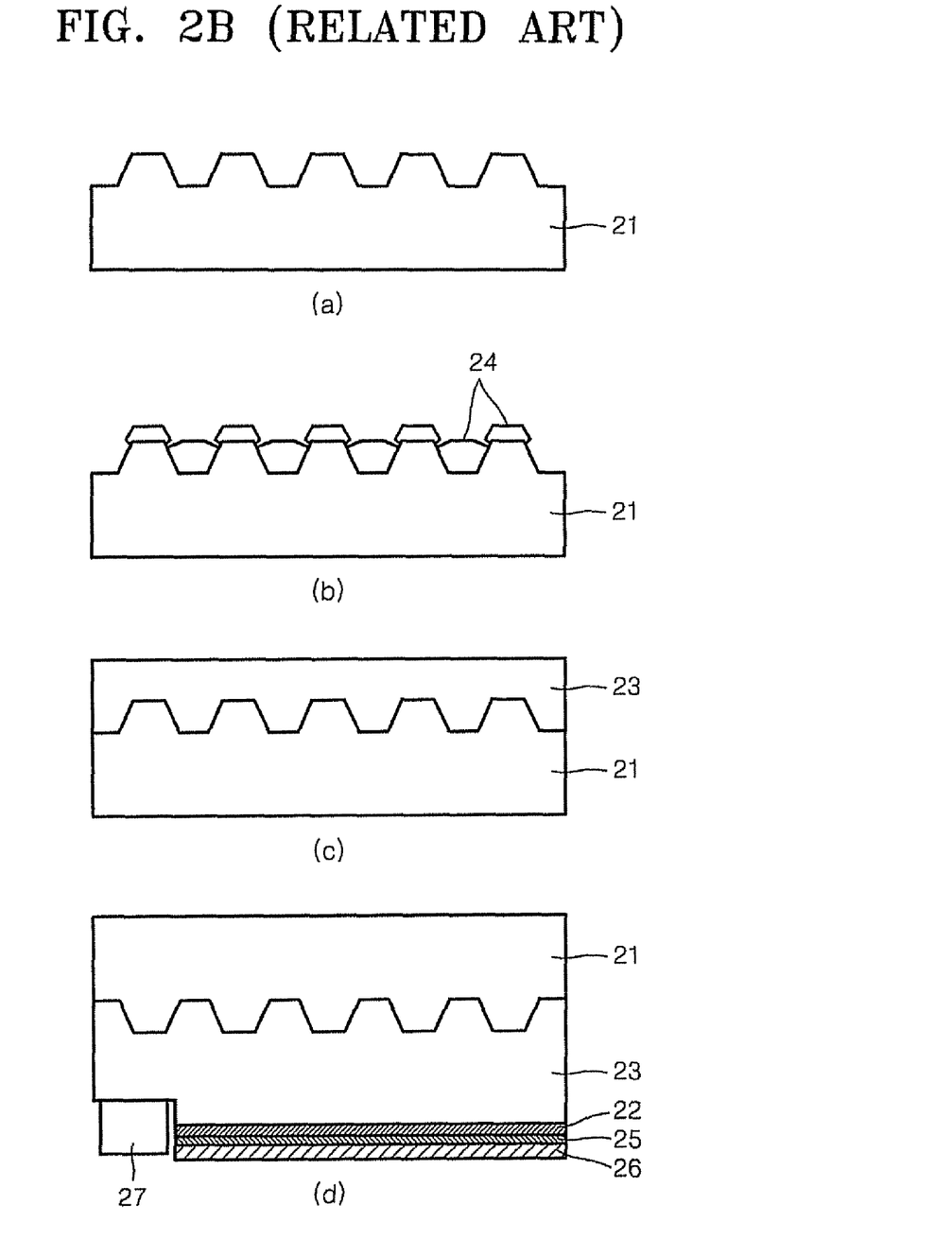
Figure 6A:
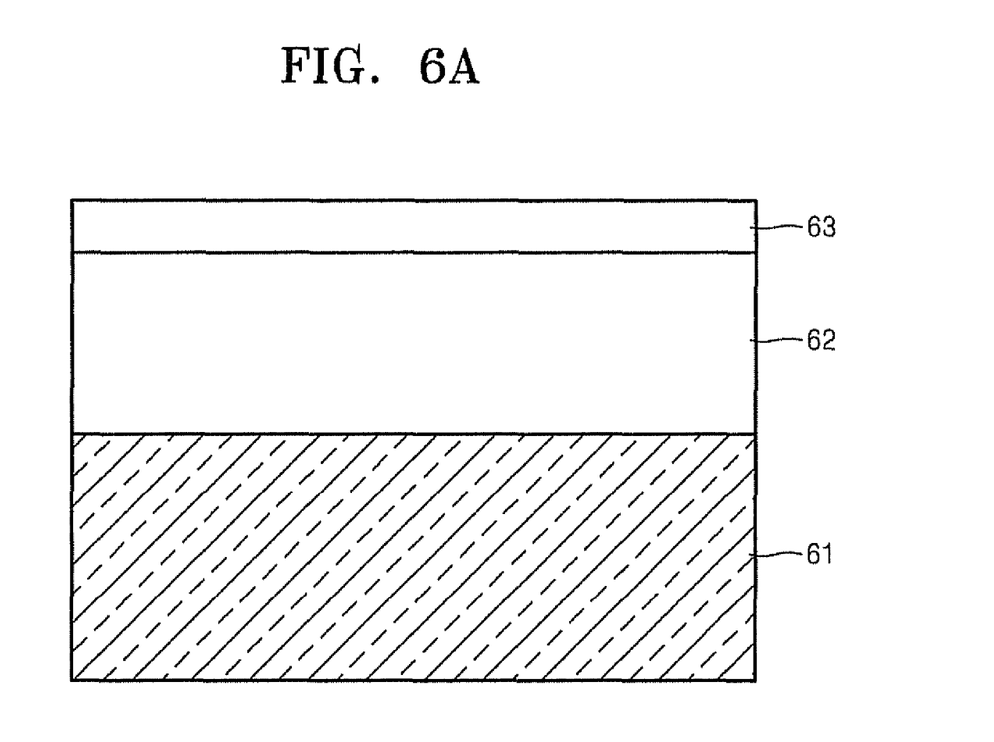
FIGS. 6A through 6C are cross-sectional views illustrating a conventional substrate having a conventional flat substrate, a substrate having a corrugated structure and an exemplary embodiment of a substrate having a multiple pattern structure according to the present invention.
Figure 6B:
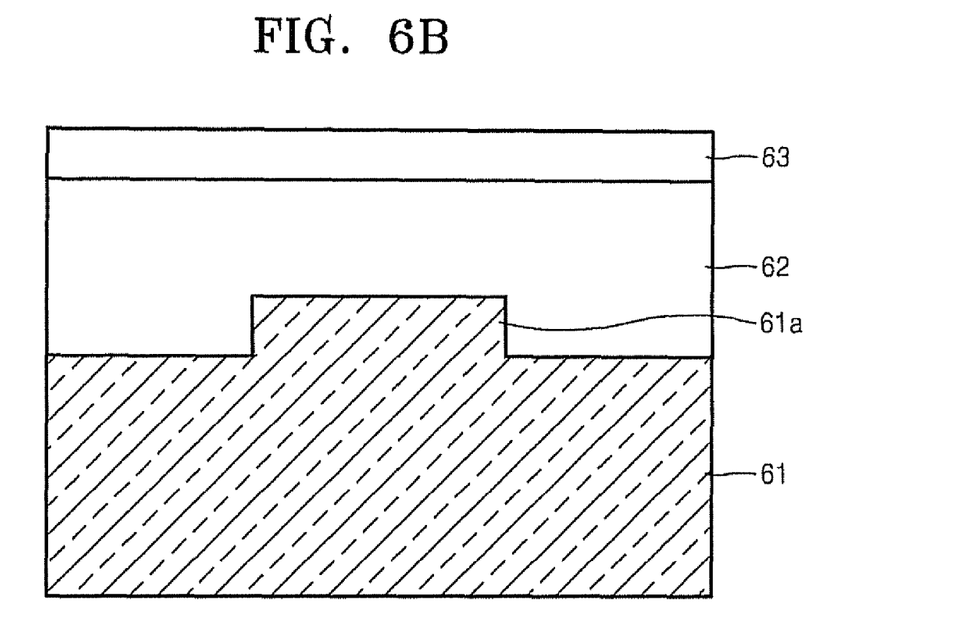
Figure 6C:
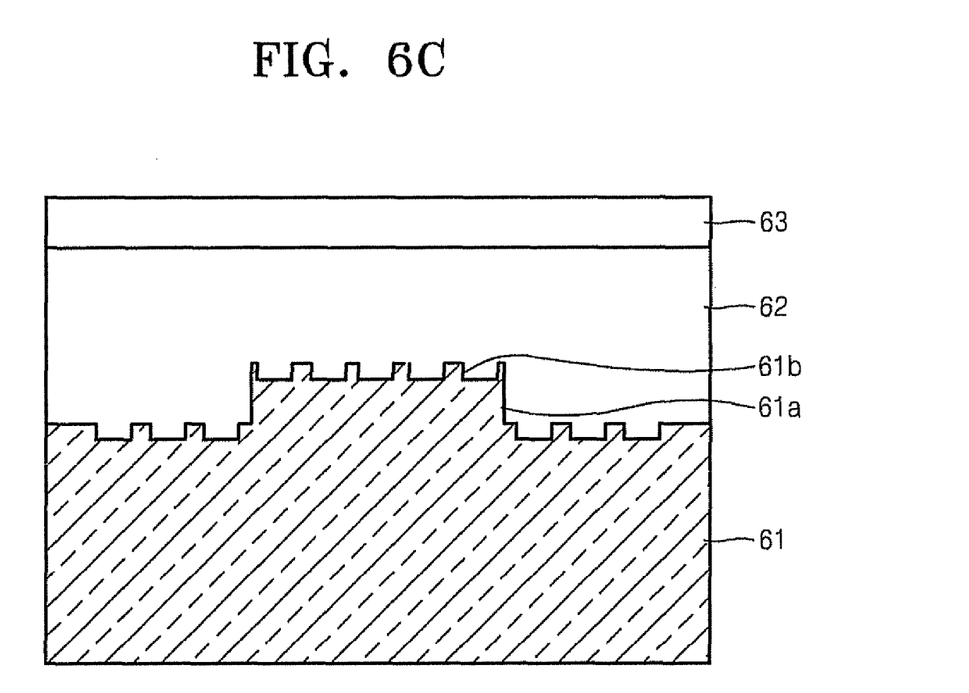

Hereinafter, the optical extraction efficiency of a conventional semiconductor light emitting device and a semiconductor light emitting device having a multiple pattern structure according to an exemplary embodiment of the present invention will be described with reference to FIGS. 6A through 6C. FIG. 6A is a cross-sectional view illustrating a semiconductor light emitting device which includes a conventional flat semiconductor substrate, that is, the substrate of the semiconductor light emitting device of FIG. 1. FIG. 6B is a cross-sectional view illustrating a semiconductor light emitting device which includes a substrate having the corrugated structure of FIG. 2. FIG. 6C is a cross-sectional view illustrating a semiconductor light emitting device which includes a substrate having a multiple pattern structure according to an exemplary embodiment of the present invention.

Specifically, referring to FIG. 6A, a first semiconductor layer 62 is formed on a substrate 61 and an active layer 63 is formed on the first semiconductor layer 62.

Referring to FIG. 6B, a first semiconductor layer 62 is formed on a substrate 61, an active layer 63 is formed on the first semiconductor layer 62, and a first pattern structure 61a is formed on a surface of the substrate 61 contacting the first semiconductor layer 62.

Referring to FIG. 6C, a first semiconductor layer 62 is formed on a substrate 61 and an active layer 63 is formed on the first semiconductor layer 62. A first pattern structure 61a is formed on a surface of the substrate 61 contacting the first semiconductor layer 62 and a second pattern structure 61b is formed on the first pattern structure 61a.

Figure 7:
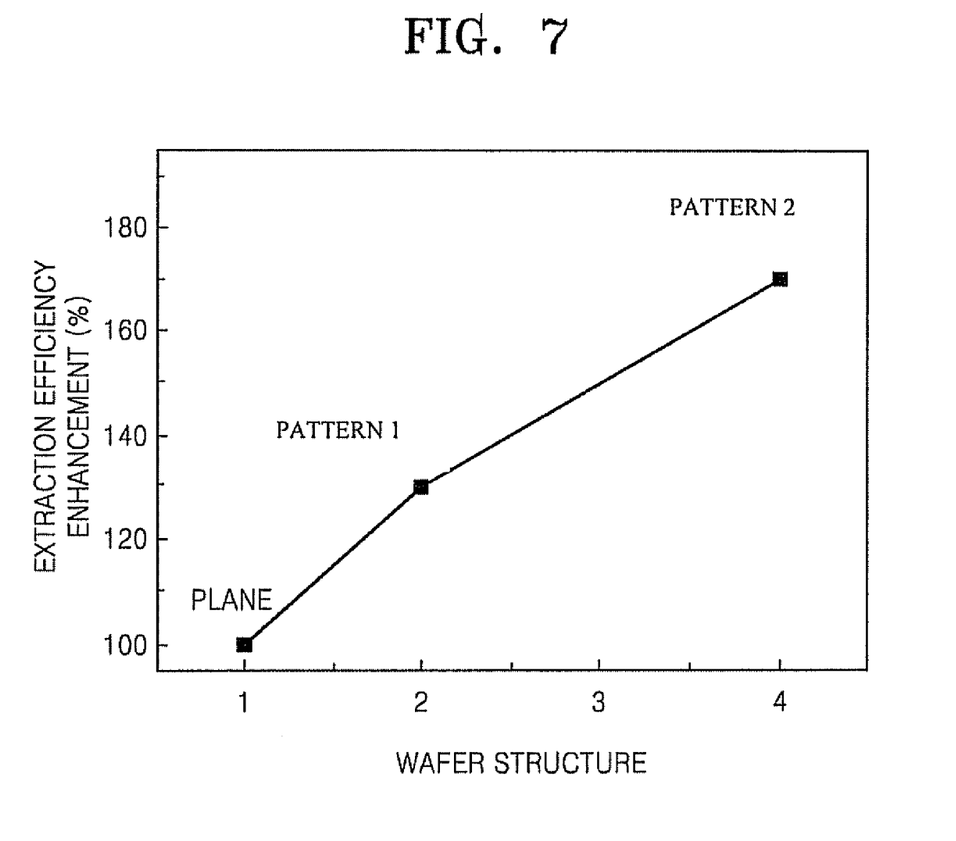
FIG. 7 is a graph showing light extraction efficiency of a light emitting device having a conventional substrate and a multiple pattern structure according to an embodiment of the present invention.

FIG. 7 is a graph showing light extraction efficiency of the light emitting devices of FIGS. 6A through 6C. The semiconductor light emitting device which uses the substrate structure of FIG. 6A is indicated as "Plane", the semiconductor light emitting device that uses the substrate structure of FIG. 6B is indicated as "Pattern 1", and the semiconductor light emitting device that uses the substrate structure of FIG. 6C is indicated as "Pattern 2".

Referring to FIG. 7, when the light extraction efficiency of the semiconductor light emitting device which uses the flat substrate of FIG. 6A is assumed to be 100%, the light extraction efficiency of the semiconductor light emitting device which uses the corrugated structure of FIG. 6B was 130%, and the light extraction efficiency of the semiconductor light emitting device which uses the multiple pattern structure of FIG. 6C was 170%. In other words, the semiconductor light emitting device which has the substrate of FIG. 6C having the multiple pattern structure according to an exemplary embodiment of the present invention shows an improvement of light extraction efficiency of approximately 70% compared to the semiconductor light emitting device which uses a conventional flat substrate of FIG. 6A, and shows an improvement of light extraction efficiency of approximately 30.8% compared to the semiconductor light emitting device which uses a substrate having a corrugated structure of FIG. 6B.

According to the present invention, the extraction efficiency of light emitted from an active layer, that is, a light emitting layer of a semiconductor light emitting device can be increased compared to a semiconductor light emitting device that uses a conventional flat substrate or a simple corrugated structure by forming a semiconductor light emitting device which includes a light emitting layer on a substrate having a multiple pattern structure in which a second pattern is formed on a surface of a first pattern.

The first pattern and the second pattern according to the present invention are not limited thereto, that is, the first pattern can be a simple corrugated type or a curved type, and the curved type can be a hemisphere type, a stripe shape, a horse shoe type, etc. The patterns can be arranged in any regular or irregular type.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor light emitting device having a multiple pattern structure, the semiconductor light emitting device comprising:
   a substrate, and
   a semiconductor layer, an active layer and an electrode layer formed on the substrate,
   the multiple pattern structure comprising:
      a first pattern defining a first corrugated structure on a surface of the substrate; and
      a second pattern defining a second corrugated nano pattern structure on the first corrugated structure of the first pattern, a part of the second pattern contacting the semiconductor layer; and
      an optically transmitting material formed in a groove of the second corrugated nano pattern structure of the second pattern, and having a different level of refractivity than that of the substrate and the semiconductor layer.

2. The semiconductor light emitting device of claim 1, wherein the second corrugated structure of the second pattern is formed on at least one of protrusions and grooves defining the first corrugated structure of the first pattern.

3. The semiconductor light emitting device of claim 2, wherein the second corrugated structure comprises at least one of a rectilinear corrugated structure and a curved type corrugated structure.

4. The semiconductor light emitting device of claim 2, wherein the protrusions are curved type protrusions.

5. The semiconductor light emitting device of claim 4, wherein the substrate is formed of a material comprising sapphire or silicon.

6. The semiconductor light emitting device of claim 4, wherein the optical transmitting material is silicon oxide or silicon nitride.

7. The semiconductor light emitting device of claim 4, further comprising:
   a first semiconductor layer formed on the substrate;
   an active layer, a second semiconductor layer and a first electrode layer sequentially formed on a first region of the first semiconductor layer; and
   a second electrode layer formed on a second region of the first semiconductor layer.

8. The semiconductor light emitting device of claim 1, wherein the first corrugated structure comprises at least one of a rectilinear corrugated structure and a curved type corrugated structure.

9. The semiconductor light emitting device of claim 1, wherein the substrate is formed of a material comprising sapphire or silicon.

10. The semiconductor light emitting device of claim 1, wherein the optical transmitting material is silicon oxide or silicon nitride.

11. The semiconductor light emitting device of claim 1,
   wherein the semiconductor layer consists of first and second semiconductor layers and the electrode layer consists of first and second electrode layers, and wherein the first semiconductor layer is formed on the substrate, the active layer, the second semiconductor layer and the first electrode layer are sequentially formed on a first region of the first semiconductor layer, and the second electrode layer is formed on a second region of the first semiconductor layer.

12. A semiconductor light emitting device having a multiple pattern structure, the semiconductor light emitting device comprising:

a substrate; and a semiconductor layer, an active layer, and an electrode layer formed on the substrate, the multiple pattern structure comprising:

a first pattern defining a first corrugated structure on a surface of the substrate, a part of the first pattern contacting the semiconductor layer and a second pattern defining a second corrugated nano dot pattern structures formed of an optically transmitting material having a different level of refractivity than that of the substrate and the semiconductor layer, and formed on the first corrugated structure of the first pattern.

13. The semiconductor light emitting device of claim 12, wherein the second pattern is formed on at least one of a plurality of curved type protrusions, or between the plurality of curved type protrusions of the first pattern.

14. A method of forming a semiconductor light emitting device having a multiple pattern structure, the method comprising:

forming a first pattern defining a first corrugated structure on a surface of a substrate; and forming a second pattern defining a second corrugated nano structure on the first corrugated structure of the first pattern;

forming an optically transmitting material in a groove of the second corrugated nano pattern structure of the second pattern, to expose a part of the second pattern;

forming a semiconductor layer on the first and second patterns, wherein the semiconductor layer is formed to contact the second pattern, wherein the optical transmitting material has a different level of refractivity than that of the substrate and the semiconductor layer.

15. The method of claim 14, wherein the forming the second pattern defining a second corrugated structure is formed on at least one of protrusions and grooves defining the first corrugated structure of the first pattern.

16. The method of claim 15, wherein the forming the second pattern defining a second corrugated structure comprises forming at least one of a rectilinear corrugated structure and a curved type corrugated structure.

17. The method of claim 14, wherein the forming the first pattern defining a first corrugated comprises forming at least one of a rectilinear corrugated structure and a curved type corrugated structure.

18. The method of claim 14, further comprising forming the substrate of a material comprising sapphire or silicon.

19. The method of claim 14, wherein the forming the second pattern includes nano pattern structures formed of an optical transmitting material on at least one of protrusions and grooves defining the first corrugated structure of the first pattern.

20. The method of claim 19, wherein the optical transmitting material is silicon oxide or silicon nitride.

* * * * *